United States Patent
Nomura et al.

[11] Patent Number: 6,157,569
[45] Date of Patent: Dec. 5, 2000

[54] NON-VOLATILE SEMICONDUCTOR MEMORY

[75] Inventors: Hidemi Nomura; Kunihiko Shibusawa; Akira Yoneyama, all of Osaka, Japan

[73] Assignee: Sanyo Electric Co., Ltd., Osaka, Japan

[21] Appl. No.: 09/251,406

[22] Filed: Feb. 17, 1999

[30] Foreign Application Priority Data

| Feb. 18, 1998 | [JP] | Japan | 10-036144 |
| Feb. 27, 1998 | [JP] | Japan | 10-047574 |
| Mar. 10, 1998 | [JP] | Japan | 10-058357 |

[51] Int. Cl.$^7$ .................................................. G11C 16/04
[52] U.S. Cl. .............................. 365/185.11; 365/185.13; 365/185.25
[58] Field of Search .................... 365/185.11, 185.13, 365/185.25

[56] References Cited

U.S. PATENT DOCUMENTS

| 5,473,563 | 12/1995 | Suh et al. | 365/185.13 |
| 5,761,119 | 6/1998 | Asano | 365/185.13 X |

*Primary Examiner*—Huan Hoang
*Attorney, Agent, or Firm*—Armstrong, Westerman, Hattori, McLeland & Naughton

[57] ABSTRACT

A memory cell array 11 is divided into plural blocks in such a manner that a first and a second split bit line BLa and BLb0 are provided for a single main bit BL0. On both opposite sides of the memory cell array 11, select transistors Q0, Q1 and Q4, Q5 and discharge transistors Q2, Q3 and Q6, Q7 are arranged. Further, on both sides of the memory cell array, a wiring 20 at a predetermined potential ARGND and wirings 21 and 22 for select control signals DCBLa and DCBLb are arranged. A second gate electrode wiring 23 connects the gate of the first select transistor Q0, that of the second discharge transistor (corresponding to Q3) relative to the adjacent main bit line and the wiring 21. A first gate electrode wiring 25 connects the gate of the second select transistor Q1, that of the first discharge transistor Q2 and the wiring 21. In such a configuration, the capacity of a non-volatile semiconductor memory is increased so that the capacitive load of bit lines can be reduced and the operation speed can be enhanced. The increase in the chip size can be prevented and easiness of the layout of the pattern of the memory can be assured.

12 Claims, 5 Drawing Sheets

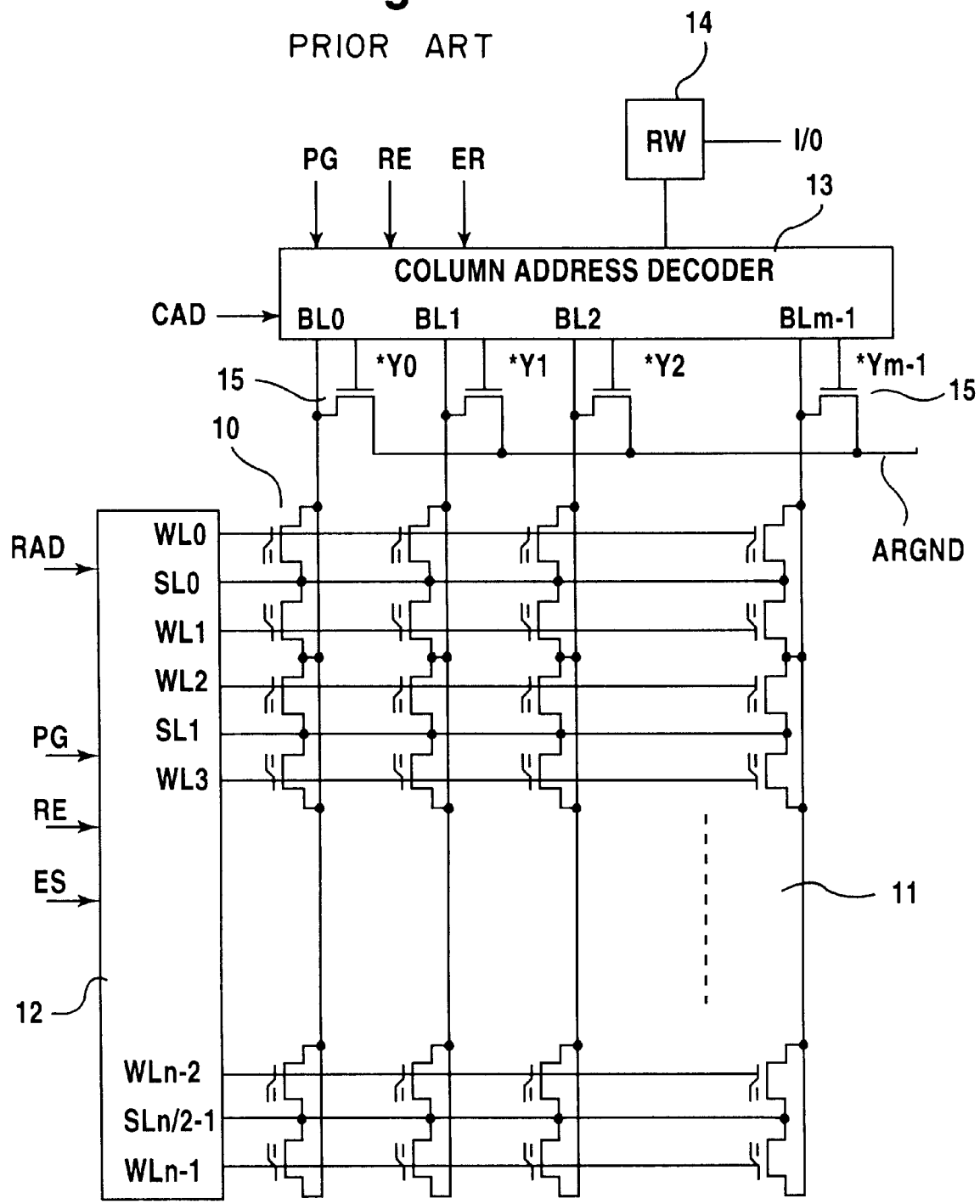

NON-VOLATILE SEMICONDUCTOR MEMORY

BACKGROUND OF THE INVENTION

1. Field of the Invention

The present invention relates to a non-volatile semiconductor memory using memory transistors each having a floating gate and a control gate.

2. Description of the Related Art

In an electrically erasable programmable ROM (EEPROM: Electrically Erasable Programmable ROM) with memory cells each composed of a single transistor, each memory cell is constructed of a transistor in a double gate structure having a floating gate and a control gate. In the case of such a transistor in a double gate structure, write of information is effected in such a manner that hot electrons injected from a drain region of the floating gate are accelerated toward a source region and passed through a gate insulating film so as to be injected into the floating gate.

Read of the information is effected in such a manner that a difference in the operation of the memory transistors is detected according to whether or not charges have not been injected in the floating gate.

Such a memory structure can be roughly classified into two kinds of a "stack gate type" and a "split gate type". The memory cell in the split gate type is structured as shown in FIG. 4 in such a fashion that on a channel formed between a drain region 1 and source region 2, a floating gate 4 is partially superposed over the source region 2 through an insulating film 3 whereas a control gate 5 is superposed over the floating gate through an insulating film 6. The drain region 1 serves a common region with an adjacent memory cell, and is connected to a bit line 8 through a contact hole 7. The source region also serves as a common region with the adjacent memory cell.

FIG. 5 shows the schematic structure of a non-volatile semiconductor memory using such split gate type memory cells. In a memory cell array 11 with a plurality of memory cells 10 arranged in a matrix with n rows and m columns, each memory cell 10 located at each of crossing points of n word lines WL (0–n-1) and m bit lines BL (0–m-1). The control gate 5 of the memory cell 10 in FIG. 4 is connected to the word line WL, and the drain (region) 1 in FIG. 4 is connected to the bit line BL. The source 2 in FIG. 4 of the memory cell 10 in each row connected to adjacent word lines WL is connected to a common source line SL (0–n/2-1). For example, the memory cell connected both word lines WL0 and WL1 is connected to the common source line SL0. A row address decoder 12 selects one of the word lines WLs on the basis of an applied load address data RAD and also supplies a voltage to the selected word line WL according to each of signals ES, PG and RE indicative of an erase mode, program mode and read mode, respectively. The row address decoder 12 supplies a voltage according to each mode to the common source line SL relative to the selected word line W. A column address decoder 13 selects one of th e bit lines BLs on the basis of an applied column address data CAD, and applies a voltage, which is controlled by a write/read control circuit 14, to the bit line BL selected in accordance with a program mode PG and a read mode signal RE.

On the other hand, in order to prevent discharge of the bit line in the erase and read modes and erroneous write in the program mode, between each bit line BL and a potential line ARGND, an MOS transistor 15 is arranged which is controlled by each of the inverted signals *Yo to *Ym-1 of the decode outputs from the column address decoder 13. For example, if the bit line BL0 is selected as a result that the column address data CAD has been decoded in the read mode and program mode, the decode output *Y0 is at a "L" level and the other decode outputs *Y1 to *Ym-1 are at an "H" level. Thus, the other bit lines BL1 to BLm-1 than the selected bit line BL0 are connected to the potential line ARGND through the MOS transistors 15 which have turned "ON".

Referring to FIGS.4 and 5, an explanation will be given of the erase mode, program mode and read mode of the non-volatile semiconductor memory.

(1) Erase Mode

When the erase mode signal ES becomes active, the row address decoder 12 applies an erase voltage Ve (e.g. 14.5 V) to the word line (e.g. WL0) selected on the basis of the address data RAD, and applies a ground potential (0 V) to the other non-selected word lines WL1 to WL. The row address decoder 12 also applies the ground potential to all the common source lines SL0–SLn/2-1.

On the other hand, the column address decoder 13 places all the decode inverted outputs *Y0–*Ym-1 at the "H" level so that the all the MOS transistors 15 are "ON". Thus, all the bit lines BLs are connected to the potential line ARGND. At this time, since the potential line ARGND is at a grounding potential, all the bit lines BLs are in a state where the grounding potential is applied to them. Thus, an erase voltage of 14.5 V is applied to the control gates 5 of all the memory cells connected to the word line WL0, and a voltage of 0 V is applied to the drains 1 and source 2 thereof. In the memory cell 10, in which the capacitive coupling between the sources 2 and floating gate 4 is much larger than that between the control gate 5 and floating gate 4, the potential of the floating gate 4 is fixed to the same 0 V as the source 2 by the capacitive coupling, and the potential difference of 14.5 V is created between the control gate 5 and floating gate 4. Thus, the F-N (Fowler-Nordheim) tunnel current flows through a tunneling oxide film (6a in FIG. 4). Namely, the electrons which have been injected into the floating gate are extracted from the protruding potion of the floating gate 4 into the control gate 5. Accordingly, the batch erase of the memory cells connected to the one word line W1 can be implemented.

(2) Program Mode (Write Mode)

When the program mode signal PG becomes active, the row address decoder 12 applies a select voltage vgp (e.g. 2 V) to the word line (e.g. WL0) selected on the basis of an applied row address data RAD, and applies a grounding potential of 0 V to the other non-selected word lines WL1–WLn-1. The row address decoder 12 supplies a program voltage Vp (e.g. 12.2 V) to the common source line SL0 relative to the selected word line WL0. On the other hand, the column address decoder 13 connects the bit line BL (e.g. BL0) selected on the basis of the column address data CAD to a read/write circuit 14. Therefore, the voltage based on the write data applied to an input/output terminal I/O is applied to the selected bit line BL0. For example, if "0" is applied to the input/output terminal I/O, a write enable source voltage Vse (0.9 V) is applied to the bit line BL0. If "1" is applied to the input/output terminal I/O, a write disable source voltage Vsd (4.0 V) is applied to the bit line BL0. The other non-selected bit lines BL1 to BLm-1 are connected to the potential line ARGND set at the write disable source voltage Vsd (4.0 V).

Thus, in the memory cell 10 specified by the word line WL0 and bit line BL0, when the input/output terminal I/O is "0", 12.2 V is applied to the source 2, 0.9 V is applied to the drain 1 and 2.0 V is applied to the control gate 5. As a result, although carriers flow from the drain 1 to the source 2, the potential at the floating gate 4 is approximately equal to that at the source 2 because of the capacitive coupling therebetween. Therefore, the carriers are injected as hot electrons into the floating gate 4 through the insulating film 3. On the other hand, in the non-selected memory cells 10, since the voltages at the drain 1, source 2 and control gate 5 do not satisfy the programming condition, injection of the carriers into the floating gate 4 does not occur.

(3) Read Mode

When the read mode signal RE is active, the row address decoder 12 applies a selecting voltage Vgr (4.0 V) to the word line WL (e.g. WL0) selected on the basis of a row address data RAD, and also applies a grounding voltage (0 V) to all the common source lines SL. On the other hand, the column address decoder 13 connects the bit line BL (e.g. BL0) selected on the basis of a column address data CAD to the write/read circuit 14. The read of data held in the memory cell 10 specified by the word line W0 and the bit line BL0 is effected. On the other hand, the non-selected bit lines BL1–BLm-1 are connected to the potential line ARGND held at the grounding potential (0 V) through the MOS transistors 15. Thus, when the column address is shifted, the initial state of read of the other bit lines BL is biased from 0 V by the write/read circuit 14, thereby preventing the erroneous operation of read. As described above, in each mode, a predetermined voltage is selectively applied to the word lines WLs, bit lines BLs and common source lines SLs so that the erasing, programming or reading conditions can be satisfied. Additionally, in the stand-by mode other than the modes described above, all the MOS transistors are "ON" so that all the bit lines are connected to the potential line ARGND set at the grounding potential 0 V and hence discharged to 0 V.

As the degree of miniaturization advances with a progress of a semiconductor manufacturing technique, the non-volatile semiconductor memory as shown in FIG. 5 has increased its storage capacity as 16 M bits, 32 M bits and further 64 M bits. This has increased the parasitic capacitance abruptly. Specifically, since junction capacitances of the drains 1 are connected in parallel to a single bit line BL, if the number of the memory cells 10 becomes twice or four times, the parasitic capacitance also becomes twice or four times. This increases the load of the write/read circuit and lengthens the write time and read time. Further, this lengthens the time required for the bit lines to be discharged (or precharged) to a predetermined voltage by connecting the bit lines BLs to the potential line ARGND through the MOS transistors 15. As a result, the operation speed of the non-volatile semiconductor memory is reduced and its characteristic is deteriorated.

SUMMARY OF THE INVENTION

The present invention has been accomplished under the circumstance described above, and intends to provide a non-volatile semiconductor memory which can provide a high operation speed even with a progress in miniaturization and can effect write/read with high reliability.

A first aspect of the memory is a non-volatile semiconductor memory of the first invention, which comprises: a memory cell array including a plurality of non-volatile memory cells, and a plurality of word lines and bit lines connected to the non-volatile memory cells, the memory cell array being divided into a plurality of blocks; a row decoder for selecting the word lines on the basis of row address data a column decoder for selecting the bit lines on the basis of column address data; column select switches each for selectively connecting the bit lines in any block selected from the plurality of blocks to the column decoder; and potential select switches each for connecting the remaining block or blocks to a first potential line.

In this configuration, since the bit lines are selectively connected to the column address decoder, capacitive load of a write/read circuit can be reduced.

A second aspect of the memory is a non-volatile semiconductor memory of the first aspect, wherein the bit lines include a plurality of main bit lines connected to the column decoder and first and second split bit lines connected to each of the main bit lines;

the memory cell array is divided with respect to a row address to include at least first and second memory cell array blocks connected to the first and second split bit lines;

the first potential line is a discharge potential line;

the column select switches each includes a first and a second column select switch provided between each the main bit lines and the first split bit line and between each the main bit lines and the second select split line; and the discharge potential switches each includes a first and a second discharge potential switch provided between the discharge potential line and the first split bit line and between the discharge potential line and the second select split line.

A third aspect of the memory is a nan-volatile semiconductor memory of the-second aspect, wherein the first column select switch and the second discharge select switch are controlled by a first control signal, and the second column select switch and the first discharge select switch are controlled by a second control signal.

In this configuration, when one of the first memory cell array block and the second memory cell array block are connected to the main bit line, the bit lines of the other memory cell array block can be connected to the discharge potential line by the same control signal. Therefore, in a state where the one block is selected, the split bit lines in the other block are located in a discharged state so that when the other block is selected subsequently, the semiconductor memory can be swiftly boosted.

A fourth aspect of the memory is a non-volatile semiconductor memory of the third aspect, wherein the first control signal and the second control signal are complementary signals to each other.

In this configuration, when one of the first memory cell array block and the second memory cell array block are connected to the main bit line, the bit lines relative to the other memory cell array block can be connected to the discharge potential line by the same control signal. Therefore, in a state where the other block is selected, all the bit lines in the one block are located in a discharged state. In this way, the connection state and discharged state can be controlled alternately by the complementary signals. Thus., the semiconductor memory can be operated very effectively and boosted swiftly.

A fifth aspect of the memory is a non-volatile semiconductor memory of the first aspect, wherein the bit lines include a plurality of main bit lines connected to the column decoder and first and second split bit lines connected to each of the main bit lines;

the column select switches each includes a first and a second transistor arranged on the periphery of the memory cell array, for selecting either the first or the second split bit line to each the main bit lines;

the potential select switches each includes a first and a second discharge transistor provided between the first and the second split bit line and the discharge potential line;

a gate electrode of the second select transistor provided between each the main bit lines and the second split bit line is connected, as a first gate electrode wiring, to that of the first discharge transistor provided between the discharge potential line and the first split bit line; and a gate electrode of the first select transistor provided between each the main bit lines and the first split bit line is connected, as a second gate electrode wiring, to that of the second discharge transistor relative to an adjacent main bit line.

In this configuration, the memory cell array is provided with the plurality of main bit lines connected to the column address decoder, the plurality of split bit lines connected to each the main bit lines, and select transistors for selecting either the first or the second split bit line to each the main bit lines. Therefore, the split bit lines can be selectively connected to the column address decoder so that the capacitive load for the write/read circuit can be reduced.

A sixth aspect of the memory is a non-volatile semiconductor memory of the fifth aspect, wherein the second gate electrode wiring extends to cross the first split bit line.

In this configuration, since a region can be given where the second gate electrode wiring and the first split bit line are proximate to each other, in this region, they can be connected to same signal terminal, thereby reducing the wiring distance and preventing the increase in capacitance.

The gate electrode of the select transistor relative to the one main bit line can be extended so that the same gate electrode wiring can be used for the gate electrode of the discharge transistor relative to an adjacent main bit line. Therefore, the select transistors having a longer arrangement pitch than that of the memory cell array can be laid out without increasing the chip size.

A seventh aspect of the memory is a non-volatile semiconductor memory of the fifth aspect, wherein the first and the second select transistor are transistors with their sources or drains being formed in a common region.

In this configuration, since the source (or drain) region of the first and second select-transistor are formed in the common region, the area occupied by them can be reduced, thereby preventing the chip size from being increased.

An eighth aspect of the memory is a non-volatile semiconductor memory of the fifth aspect, wherein the first and the second discharge transistor are transistors with their sources or drains being formed in a common region.

In this configuration, since the source (or drain) region of the first and second select transistor are formed in the common region, the area occupied by them can be reduced, thereby preventing the chip size from being increased.

A ninth aspect of the memory is a non-volatile semiconductor memory of the first aspect, wherein the bit lines include a plurality of main bit lines connected to the column decoder and first and second split bit lines connected to each of the main bit lines;

the column select switches are select transistors arranged on the periphery of the memory cell array, for selecting either the first or the second split bit line to each the main bit lines;

the potential select switches are discharge transistors arranged outside the column switches with respect to the memory cell array, for connecting the split bit lines to the discharge potential line; and the select transistors and the discharge transistors are arranged in a repetition pattern at regular intervals, the discharge transistors are staggered from the select transistors, and at least one of the select transistors and one of the discharge transistors are connected to each other by a continuous common gate electrode wiring.

In this configuration, since the split bit lines are selectively connected to the column decoder, the capacitive load of a write/read circuit can be reduced.

Further, the select transistors and discharge transistors are arranged on the periphery of the memory cell array, the discharge transistors are staggered from the select transistors, and at least one of the select transistors and one of the discharge transistors are connected to each other by a continuous common gate electrode wiring. Thus, the select transistors and discharge transistors having a longer arrangement pitch than that of the memory cell array can be laid out without increasing the chip size.

A tenth aspect of the memory is a non-volatile semiconductor memory of the ninth aspect, wherein the common gate wiring is extended linearly.

In this configuration, the wiring pattern can be simplified, thereby decreasing the wiring length and preventing the increase in capacitance.

An eleventh aspect of the memory is a non-volatile semiconductor memory of the ninth aspect, wherein the select transistors and the discharge transistors are located at opposite positions to sandwich the memory cell array there between. In this configuration, the main bit lines and split bit lines can be alternately in a staggered fashion, thereby preventing the increase in cell size.

A twelfth aspect of the memory is a non-volatile semiconductor memory of the ninth aspect, wherein two of the split bit lines are connected to one of the main bit lines.

The above and other objects and features of the present invention will be more apparent from the following description taken in conjunction with the accompanying drawings.

BRIEF DESCRIPTION OF THE DRAWINGS

FIG. 5 is a circuit diagram of a prior art.

DESCRIPTION OF PREFERRED EMBODIMENTS

Embodiment 1

Figure 1:
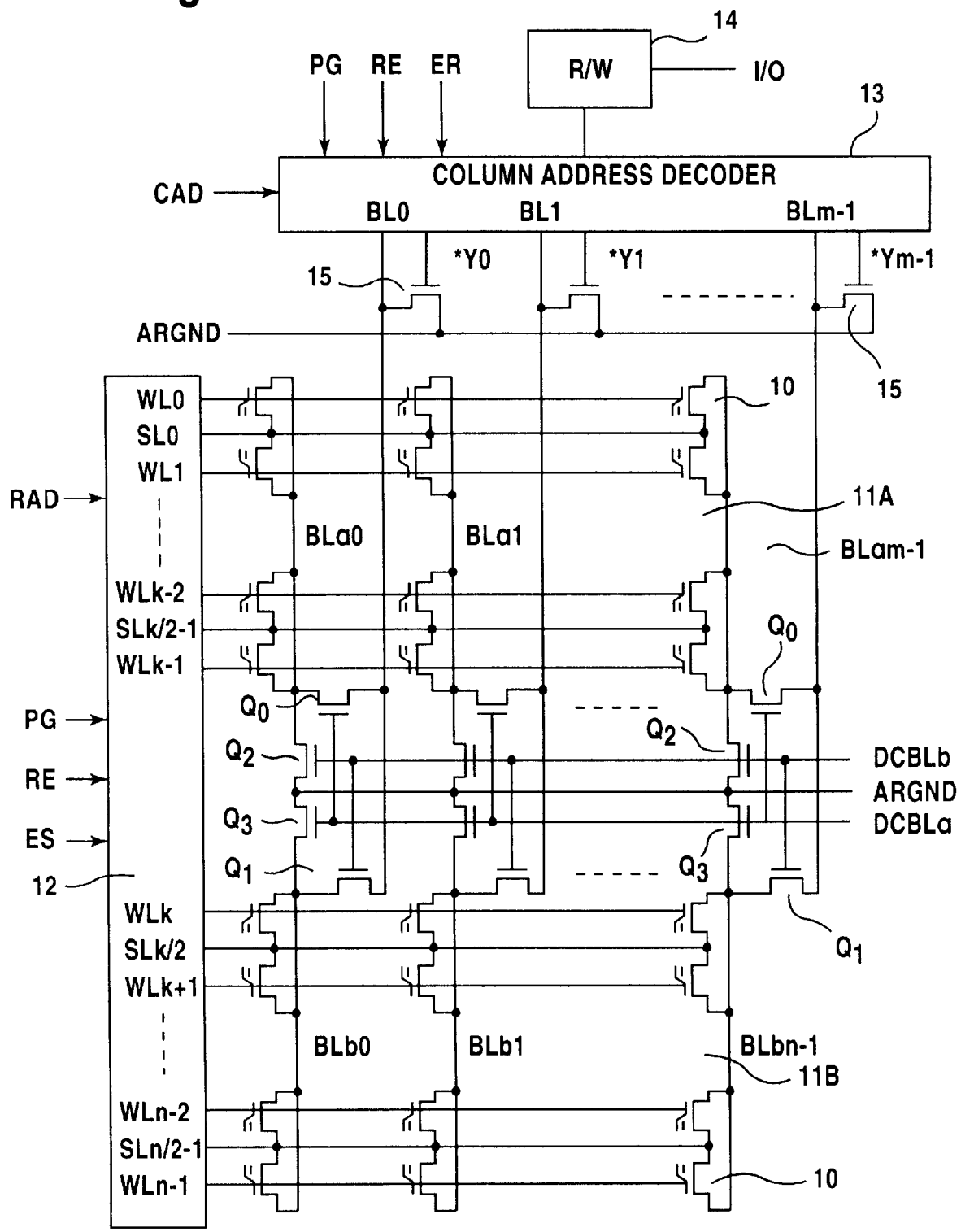
FIG. 1 is a circuit diagram for explaining the first embodiment of the present invention.

FIG. 1 shows a first embodiment according to the present invention in which the memory cell array is divided into two parts. In FIG. 1, the row address decoder 12, column address decoder 13 and write/read circuit 14, which are substantially equivalent to the corresponding components in FIG. 5, will not be explained.

The memory cell array is divided into a first cell array block 11A and a second cell array block 11B. The cell array blocks 11A and 11B are each composed of memory cells arranged in a matrix with k rows and m columns. The first cell array block 11A is provided with word lines WL0–WLk-1, and common source lines SL0 –SLk/2-1. The first block 11A is also provided with m bit lines of BLa0–BLam-1. The first block 11A is provided with discharge potential select switches, i.e. MOS transistors Q0, each controlled by a control signal DCBLa, arranged between the bit lines Bla0–Blam-1 and the main bit lines BL0–Blm-1 extended from the column address decoder 13. The first block 11A is also provided with discharge potential select switches, i.e. MOS transistors Q2, each controlled by a control signal DCBLb, arranged between the bit lines Bla0–Blam-1 and the potential line ARGND.

On the other hand, the second cell array block 11B is provided with word lines Wlk–WLn-1, and common source lines SLk/2–SLn/2-1. The second block 11B is also provided with m bit lines of BLb0–BLbm-1. The second block 11B is provided with column select switches MOS transistors Q1, each controlled by a control signal DCBLb, arranged between the bit lines BLb0–BLam-1 and the main bit lines BL0–BLm-1 extended from the column address decoder 13. The second block 11B is also provided with column select switches, i.e. MOS transistors Q3, each controlled by a control signal DCBLa, arranged between the bit lines BLb0–BLbm-1 and the potential line ARGND.

The control signals DCBLa and DCBLb are supplied from a row address detecting circuit (not shown) in accordance with the contents of a row address data RAD. Specifically, the control signal DCBLa is a signal which is at an "H" level when the row address data RAD is directed to the word lines WL0–WLk-1, i.e. when the first cell array block 11A is selected. The control signal DCBLb is a signal which is at the "H" level when the row address data RAD is directed to the word lines WLk–WLn-1, i.e. when the second cell array block 11B is selected. Therefore, when the control signal DCBLa becomes the "H" level, the MOS transistors Q0 and Q3 become "ON" so that the bit line BLa of the first cell array block 11A is connected to the main bit line BL and the bit line BLb of the second cell array block 11B is connected to the potential line ARGND. On the other hand, when the control signal DCBLb is "H" level, the result of connection is quite the reverse to the above case.

An explanation will be given of each of the modes in the embodiment as shown in FIG. 1.

(1) Erase Mode

When the erase mode signal ES is active, if the row address data RAD selects the first cell array block 11A, the selected word line WL (e.g. WL0) is at the erase voltage Ve (e.g. 14.5V), the non-selected word lines WL1–WLn-1 are at the grounding potential (0 V), and all the common source lines SL are at the ground potential. The column address decoder 13 places all the decode inverted outputs *Yo–*Ym-1-at the "H" level so that the all the MOS transistors 15 are "ON". Thus, all the main bit lines BL are connected to the potential line ARGND. Since the potential line ARGND is at the ground potential (0 V), 0 V is applied to all the main bit lines BL.

On the other hand, in this erase mode, the control signal DCBLa is at the "H" level, and the DCBLb is at the "L" level so that the MOS transistor Q0 are "ON". Thus, The voltage of 0 V is applied to all the bit lines, which are connected to the main bit lines BL, from the potential line ARGND through the MOS transistors 15. Since the MOS transistors Q3 are also "ON", the bit lines BLb of the second cell array block 11B are connected to the potential line ARGND so that they are at 0 V.

Accordingly, the batch erase for all the memory cells 10 connected to the word line WL0 is completed.

(2) Program Mode (Write Mode)

When the program mode signal PG becomes active, the row address decoder 12 applies a select voltage Vgp (e.g. 2 V) to the word line (e.g. WL0) selected on the basis of an applied row address data RAD, and applies a grounding potential of 0 V to the other non-selected word lines WL1–WLn-1. The row address decoder 12 supplies a program voltage Vp (e.g. 12.2 V) to the common source line SL0 relative to the selected word line WL0. On the other hand, the column address decoder 13 connects the main bit line BL (e.g. BL0) selected on the basis of the column address data CAD to the read/write circuit 14. Therefore, the voltage based on the write data applied to an input/output terminal I/O is applied to the selected main bit line BL0. For example, if "0" is applied to the input/output terminal I/O, a write enable source voltage Vse (0.9 V) is applied to the main bit line BL0. If "1" is applied to the input/output terminal I/O, a write disable source voltage Vsd (4.0 V) is applied to the bit line BL0. The other non-selected main bit lines BL1 to BLm-1 are connected to the potential line ARGND set at the write disable source voltage Vsd (4.0 V). At this time, since the control signal DCBLa is at the "H" level, while DCBLb is at the "L" level, the MOS transistors Q0 and Q3 are "ON" while the MOS transistors Q2 and Q1 are "OFF". Therefore, the bit lines BLa of the first cell array block 11A are connected to the main bit lines BL and the bit lines BLb of the second cell array block 11B are connected to the potential line ARGND. Thus, the bit line BLa0 is connected to the write/read circuit 14 through the main bit line BL0 whereas the other bit lines BLa1–BLam-1 are supplied with the write disable voltage of 4.0V from the potential line ARGND. Further, all the bit lines BLb are supplied with the write disable voltage of 4 V from the potential line ARGND through the MOS transistor Q3. Accordingly, the write for only the memory cell 10 specified by the word line WL0 and the bit line BLa0 is effected.

(3) Read Mode

When the read mode signal RE is active, the row address decoder 12 applies a selection voltage Vgr (4.0 V) to the word line WL (e.g. WL0) selected on-the basis of a row address data RAD, and also applies a grounding voltage (0 V) to all the common source lines SL. On the other hand, the column address decoder 13 connects the main bit line BL (e.g. BL0) selected on the basis of a column address data CAD to the write/read circuit 14. On the other hand, the non-selected bit lines BL1–BLm-1 are connected to the potential line ARGND held at the grounding potential (0 V) through the MOS transistors 15. At this time, since the control signal DCBLa is at the "H" level while the control signal DCBLb is at the "L" level, as in the program mode, the bit lines BLa are connected to the main bit lines BL through the MOS transistors 15, and the bit lines BLb are connected to the potential line ARGND through the MOS transistors Q3 and supplied with 0 V. Thus, the read of data held in the memory cell 10 selected by the bit line BLa0 and the word line WL0 is effected, and the other bit lines BLa1–BLam-1 are discharged to 0 V. All the non-selected bit lines BLb of the second cell array block 11B are also discharged to 0 V. For this reason, when the column address is shifted, or the row address is shifted, the initial state of read of the non-selected bit lines is biased from 0 V by the write/read circuit 14, thereby preventing the erroneous operation of read.

(4) Stand-by Mode

In the three modes described above, the control signals DCBLa and DCBLb are inverted signals from each other, i.e. complementary signals to each other. However, in the stand-by mode, for the purpose of prevention of the erroneous operation and abrupt transition to subsequent mode, all the bit lines of the memory cell arrays must-be discharged to the grounding potential. Therefore, the control signals DCBLa and DCBLb are placed at the "HI" level and all the outputs *Y from the column address decoder 13 are placed at the "H" level. Thus, the MOS transistors 15, Q0, Q2, Q1 and Q3 are all "ON" so that the bit lines BLa, BLb and BL are all connected to the potential line ARGND set at the grounding potential and discharged.

Incidentally, in the embodiment as shown in FIG. 1, although the memory cell array is divided into the first cell array block and the second cell array block, it may be divided into four blocks or six blocks. For example, where it is divided into four blocks, third and fourth cell array blocks are provided each having the same structure as that of the first and second cell array blocks as shown in FIG. 1, and the bit lines of each block are connected to the main bit lines BL. In this case, the control signals corresponding to the control signals DCBLa and DCBLb are referred to e.g. DCBLc and DCBLd which are complementary signals to each other. Where the first cell array block 11A or second cell array block 11B is selected, the control signals DCBLc and DCBLd are placed at the "L" level so that the bit lines of the third or fourth cell array block are in a floating state and hence not connected to the main bit lines. Inversely, where the third or fourth cell array block is selected, the control signal DCBLa and DCBLb are placed at the "L" level.

As understood from the description of the respective modes, the bit lines of the divided-cell array blocks 11A and 11B, only when the pertinent cell array block is selected, are connected to the main bit lines of the column address decoder 13. This reduces the capacitive load of the write/read circuit 14. Further, the bit lines of the non-selected cell array blocks are connected to the potential line ARGND through the MOS transistors for discharging. For this reason, the initial value of read when the pertinent block is selected is fixed, which contributes to prevent the erroneous read operation. Furthermore, since the voltage applying condition in each mode can be attained by the low capacitive load, the high speed operation of the non-volatile semiconductor memory can be realized.

Embodiment 2

An explanation will be given of a second embodiment of the present invention. The second embodiment has an equivalent circuit structure to the first embodiment, but provides a circuit connection for simplifying the pattern layout.

Figure 2:
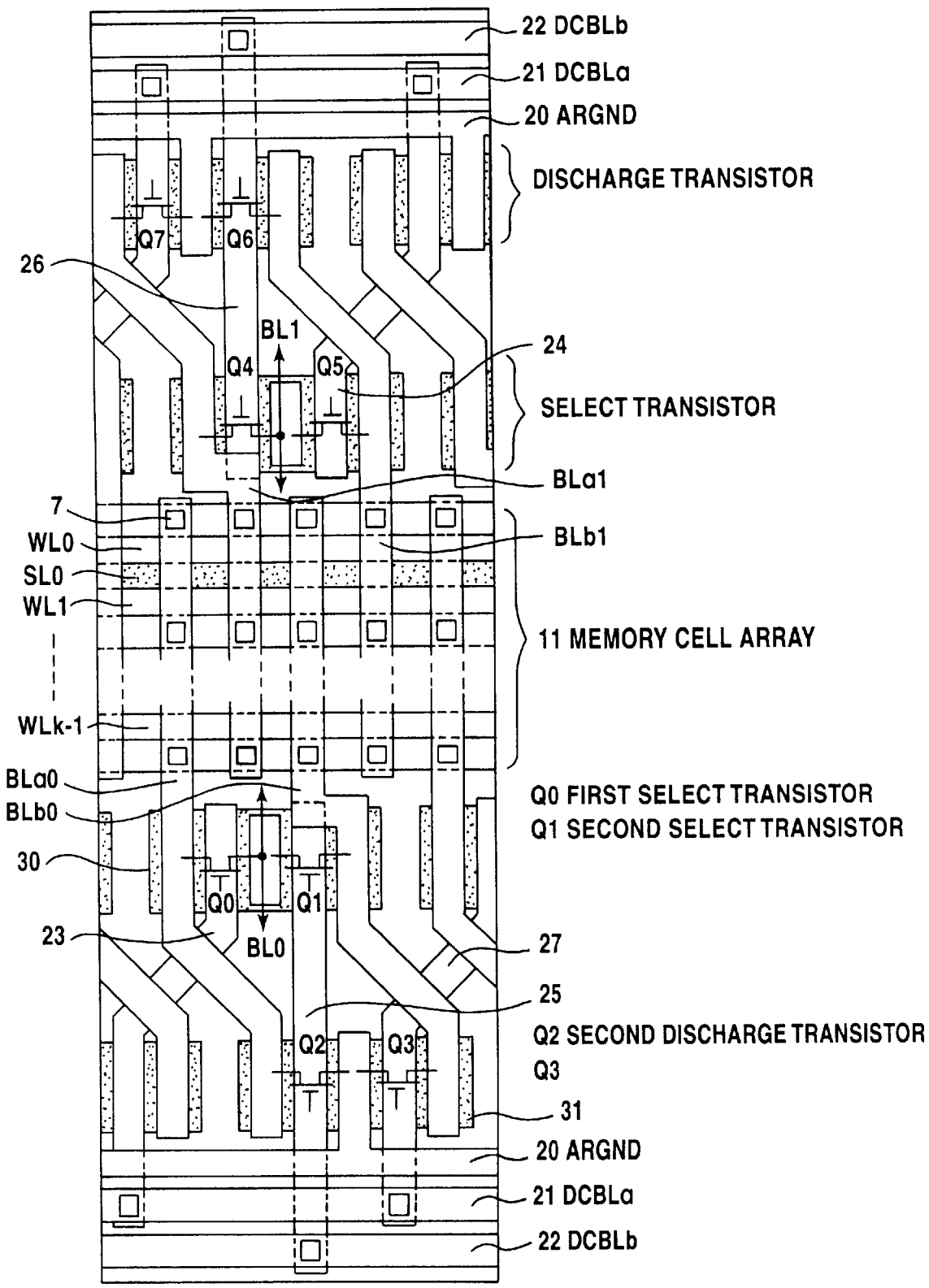
FIG. 2 is a plan view showing the second embodiment of the present invention.
Figure 3:
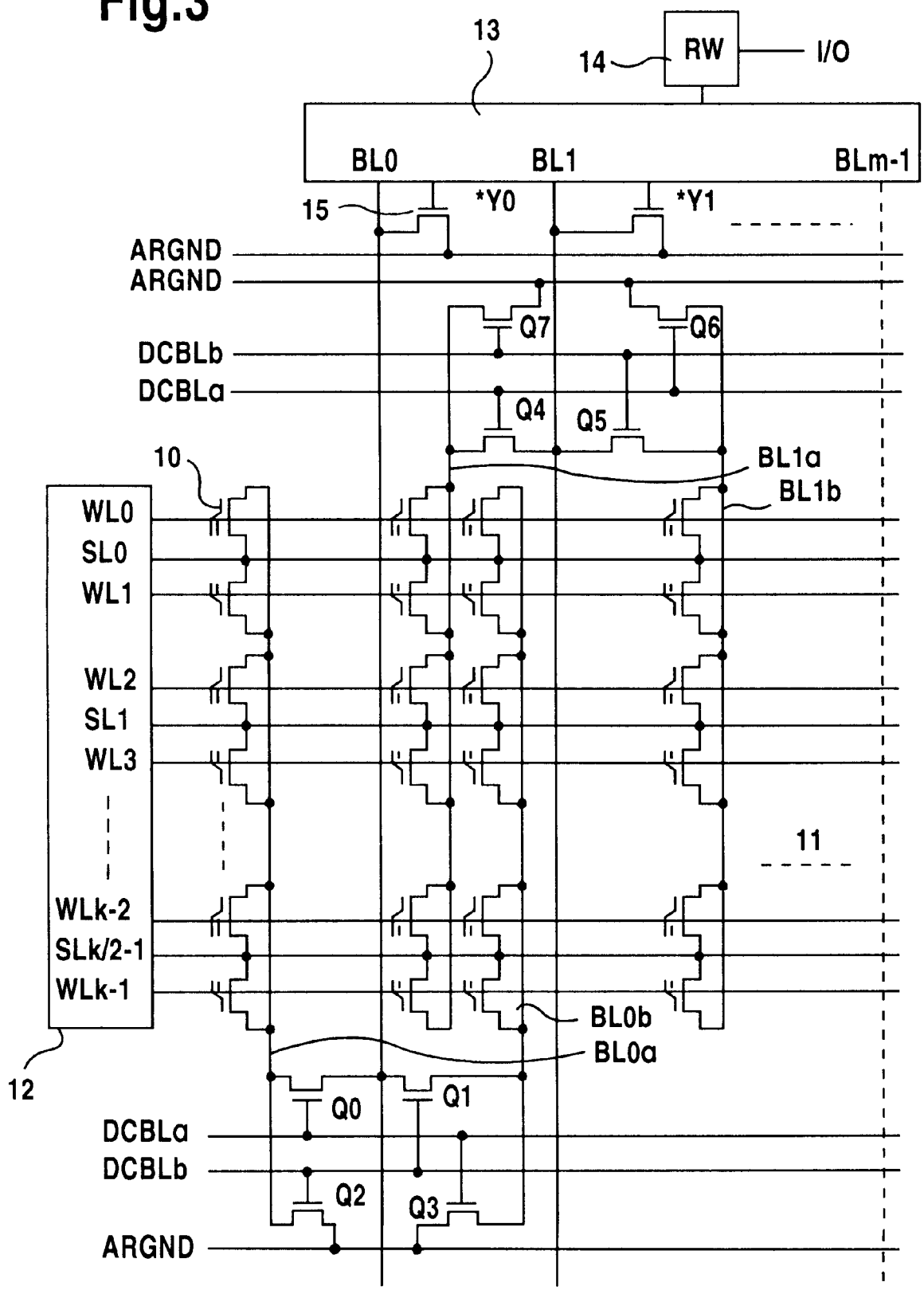
FIG. 3 is a circuit diagram of the second embodiment of the present invention.

FIG. 2 is a plan view of the pattern layout of a memory cell array part. FIG. 3 is a circuit diagram showing its circuit configuration. Now referring to FIG. 3, an explanation will be given of the circuit configuration according to this embodiment.

In FIG. 3, the row address decoder 12, column address decoder 13 and write/read circuit 14, which are substantially equivalent to the corresponding components in FIG. 5, will not be explained.

The memory cell array is composed of memory cells arranged in a matrix with k rows and 2m columns. The memory cell array is provided with word lines WL0–WLk-1, and common source lines SL0–SLk/2-1. The memory cell array is also provided with main bit lines of BL0–BLm-1 extending from the column address decoder 13. The main bit lines BL0–BLm-1 are each provided with two split bit lines of first split bit line BLa0–BLam-1 and second split bit line BLb0–BLbm-1. The memory cell array is separated into two blocks of a first cell array block connected to the first split bit lines BLa0–BLam-1 and a second cell array block connected to the second split bit lines BLb0–BLb-1. As a result, the split bit lines the number of which is twice as many as that of the m main bit lines BL0–BLm-1.

First select transistors Q0, Q4, each controlled by a control signal DCBLa, are arranged between the first bit lines BLa0–BLam-1 and the main bit lines BL0–BLm-1. Select transistors (first discharge transistors) Q2, Q7, each controlled by a control signal DCBLb, are arranged between the first split bit lines BLa0–BLam-1 and the potential line ARGND. Likewise, second select transistors Q1, Q5, each controlled by a control signal DCBLb, are arranged between the second split bit lines BLb0–BLam-1 and the main bit lines BL0–BLm-1. Select transistors (second discharge transistors) Q3, Q6, each controlled by a control signal DCBLb, are arranged between the second split bit lines BLb0–BLbm-1 and the potential line ARGND.

The control signals DCBLa and DCBLb are supplied from a row address detecting circuit (not shown) in accordance with the contents of a row address data RAD. Specifically, the control signal DCBLa is a signal which is at "H" level when the address data is directed to select the first cell array block connected to the first split bit lines BLa0–BLam-1. The control signal DCBLb is a signal which is at the "H" level when the address data is directed to select the second cell array block connected to the second split bit lines BLb0–BLbm-1. Therefore, when the control signal DCBLa becomes the "H" level, the select transistors Q0 and Q3 become "ON" so that the first split bit line BLa0 is connected to the main bit line BL0 and the second bit line BLb0 is connected to the potential line ARGND. On the other hand, when the control signal DCBLb is the "H" level, the result of connection is quite the reverse to the above case.

In this embodiment, the potential relationship of the memory cell array 11 in each of the operation modes (erase mode, program mode, and read mode), which is the same as the prior art, is not explained here. The control signals DCBLa and DCBLb are inverted signals from each other, i.e. complementary signals to each other. Therefore, either of the split bit lines BLa0, BLb0 is connected to the main bit line BL0 whereas the other is connected to a predetermined potential through the ARGND wiring so that a specific cell is selected in the memory cell array. Such an operation is different from the prior art. Further, in the other stand-by mode than each of the operation modes, for the purpose of prevention of the erroneous operation and abrupt transition to subsequent mode, all the bit lines of the memory cell arrays must be discharged to the grounding potential. Therefore, the control signals DCBLa and DCBLb are placed at the "H" level and all the outputs *Y from the column address decoder 13 are placed at the "H" level. Thus, the select and discharge transistors Q0–Q7 are all "ON" so that the main bit line BL, the bit lines BLa, BLb are connected to the potential line ARGND set at the grounding potential and discharged.

Figure 4:
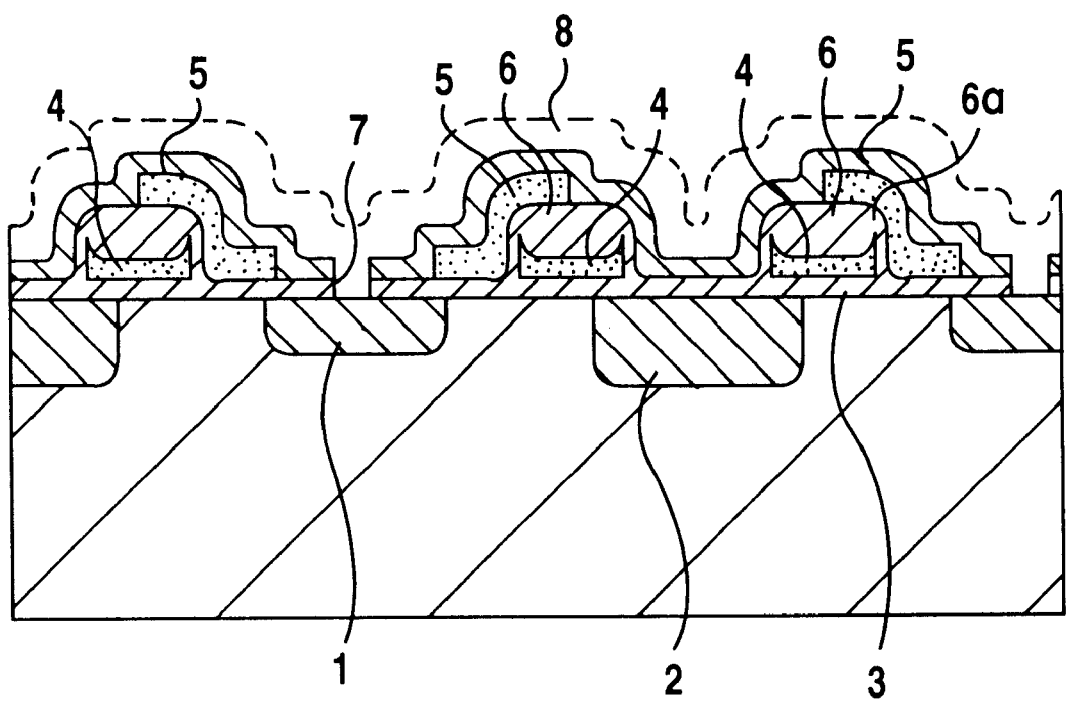
FIG. 4 is a sectional view of a cell structure of a non-volatile semiconductor memory cell.

FIG. 2 is a plan view of the pattern layout of an integrated circuit device implementing the above circuit configuration. A memory cell array 11 arranged in the vicinity of the center of the drawing is composed of memory cells 10 each of which is a floating gate-type flash memory element as shown in FIG. 4. Specifically, the control gate of the memory element is extended to constitute the word lines WL0–WLk-1, and the source region extends over each memory cell to constitute the common source lines SL0–SLk-1. The first and second split bit lines BLa0–BLam-1 and BLb0–BLbm-1 are connected to the drain region 1 of each memory cell 10 through the contact hole 7.

On both sides (upper and lower sides in FIG. 2) of the memory cell array 11, the select transistors Q0, Q1 and Q4, Q5 are arranged. On the further outsides, the discharge transistors Q2, Q3 and Q6, Q7 are arranged. On the further outsides arranged are an electrode wiring 20 for applying a predetermined potential ARGBD and electrode wirings 21 and 22 for applying the control signals DCBLa and DCBLb. A unit is-composed of the first, second split bit lines BLa0, BLb0, a pair of select transistors Q0, Q1, and a pair of discharge transistors Q2, Q3. The plurality of such units are formed in substantially the same repetitive pattern. In order to form symmetrical patterns with respect to the memory cell array 11, another unit, which is composed of the other two split bit lines BLa1, BLb1, a pair of select transistors Q4, Q5 and a pair of discharge transistors Q6, Q7, is arranged on the opposite side to the above unit. Further, the first and second bit lines BLa0, BLb0 relative to the main bit line BL0 are extended from the lower side of the drawing where the select transistors Q0, Q1 are located to the upper side of the drawing where the select transistors Q4, Q5 are located. On the other hand, the first and second split bit lines BLa1 and BLb1 relative to the adjacent main bit line BL1 are extended from the upper side of the drawing to the lower side. These split bit lines are alternately staggered in a such a fashion that subsequent to the first split bit line BLa0 relative to the main bit line BL0, the first split bit line BLa1 relative to the adjacent main bit line BL1 is located. In short, the split bit lines are arranged in parallel at regular intervals in the order of BLa0, BLb0, BLa1, BLb1, . . . Such an alternate arrangement permits the select and discharge transistors, each having a larger pattern size than the cell pitch of the memory cell array 11, to be accommodated within a range of the cell pitch.

The select transistors Q0, Q1 and Q4, Q5 are each constructed of an MOS transistor composed of two gate electrodes and a common source (or drain) located on a common active region 30 (sand-like painted in the figure) encircled by an LOCOS oxide film. The common source (or drain) is connected to the main bit line BL0, BL1 indicated by a bidirectional arrow, which is connected to the column address decoder 13. Incidentally, it should be noted that the main bit line BL0, BL1 is constructed of an electrode wiring extending in parallel to the first and second split bit lines BLa0–BLam-1 and BLb0–BLbm-1 and interlayer-insulated. In this embodiment, the select transistors Q0 and Q1 arranged on the lower part of the memory cell array are connected to the main bit line BL0, whereas the select transistors Q4 and Q5 arranged on the upper part thereof are connected to the main bit line BL1.

The discharge transistors Q2, Q3 and Q6, Q7 are each constructed of an MOS transistor composed of two gate electrodes and a common source (or drain) located on a common active region 31 (sand-like painted in the figure) encircled by an LOCOS oxide film. The common source (or drain) is connected to an electric wiring 20 to which a predetermined potential ARGND is applied. The select transistors Q0, Q1 and the discharge transistors Q2, Q3 are arranged so that their active regions 30, 31 are staggered from each other.

The first split bit line BLa0 relative to the main bit line BL0 is connected to the drain (or source) of the first select transistor Q0 through a contact hole, and in addition, it is extended aslant at an angle of about 45° and connected to the drain (or source) of the first discharge transistor Q2 through the contact hole. The second split bit line BLb0 is connected to the drain (or source) of the second select transistor Q1 through the contact hole, and in addition, it is extended aslant in parallel to the split bit line BLa0 and connected to the drain (or source) of the second discharge transistor Q3 through the contact hole. Likewise, the first split bit line BLa1 relative to the main bit line BL1 is connected to the select transistor Q4 and the discharge transistor Q7, whereas the second split line BLb1 is connected to the select transistor Q5 and discharge transistor Q6.

The first gate electrode wiring 25 of the second select transistor Q1 is extended straight on the chip to constitute a gate electrode of the first discharge transistor Q2, and is further extended to be connected to the wiring 22 of the select signal DCLBb through the through-hole. The first gate electrode wiring 25 is constructed of a polysilicon wiring layer continuously extending from the gate electrode of the transistor Q1, Q2. Likewise, the second gate electrode wiring 23 of the first select transistor Q0 is extended orthogonally to the area extending aslant of the first split bit line BLa0 to constitute the gate electrode of the second discharge transistor (corresponding to Q3) relative to an adjacent main bit line, and connected to the wiring 21 of the select signal DCBLa. The second gate electrode wiring 23 is also constructed of the polysilicon wiring layer continuously extending from the gate electrode of the transistors Q0, Q3. Incidentally, the -first split bit line BLa and the second gate electrode wiring 23 are insulated from each other by interlayer insulation and cross each other. Likewise, the second split bit line BLb0 and the second gate electrode wiring 27 are also insulated from each other by interlayer insulation and cross each other.

The transistors are formed in a successive repetitive pattern. Therefore, the second gate wiring 27 of the second discharge transistor Q3 constitutes the gate electrode wiring (corresponding to the second gate wiring 23) of the select transistor (corresponding to the select transistor Q0) relative to the adjacent main bit line. The gate electrode wiring 26 of the select transistor Q4 is connected to the gate electrode of the discharge transistor Q6, whereas the gate electrode wiring 24 of the select transistor Q5 is connected to the gate electrode of the discharge transistor relative to the adjacent bit line. Such connections are made to provide a symmetrical pattern with respect to the memory cell array 11. As understood from the circuit operation described above, since the control signals DCBLa and DCBLb are complementary signals, when e.g. the main bit line BL0 is selected and the control signal DCBLa is "H", the first select transistor Q0 turns "ON" through the second gate electrode wiring 23 and the second select transistor Q1 and first discharge transistor Q2 are "OFF" through the first gate electrode wiring 23. Thus, only the first split bit line BLa0 can be connected to the main bit line BL0. In addition, since the second discharge transistor Q3 turns "ON" through the second gate electrode wiring 27, the second split bit line BLb0 can be connected to the predetermined potential line ARGND. On the other hand, when the control signal DCBLb is "H", the second select transistor Q1 and first discharge transistor Q2 turn "ON" through the first gate electrode wiring 25. Therefore, the second split bit line BLb0 is selected, and the first split bit line BLa0 can be connected to the predetermined potential line ARGND.

In view of the combination of the transistors to which the complementary signals are applied, the first select transistor Q0 and second discharge transistor are coupled with each other by the single gate electrode wiring 23. The second select transistor Q1 and the first discharge transistor Q2 and the first discharge transistor Q2 are also coupled with each other by the single gate electrode wiring 25. In this way, the number of wirings can be decreased and the pattern can be simplified. In addition, the second gate electrode wiring 23 connects the first select transistor Q0 to the second discharge transistor relative to the adjacent main bit line, thereby shortening the routing of the wiring.

Incidentally, in the embodiment as shown in FIG. 2, although the memory cell array is divided into the first cell array block and the second cell array block, it may be divided into four blocks or six blocks. For example, where it is divided into four blocks, third and fourth cell array blocks are provided by repeating the same pattern as shown in FIG. 2. In this case, the control signals corresponding-to the control signals DCBLa and DCBLb are referred to e.g. DCBLc and DCBLd which are complementary signals to each other. Where the first cell array block or second cell array block is selected, the control signals DCBLc and DCBLd are placed at the "L" level so that the bit lines of the third or fourth cell array block are in a floating state and hence not connected to the main bit lines. Inversely, where the third or fourth cell array block is selected, the control signal DCBLa and DCBLb are placed at the "L" level.

As understood from the above description, the bit lines of the divided cell array blocks, only when the pertinent cell array block is selected, are connected to the main bit lines of the column address decoder 13. This reduces the capacitive load of the write/read circuit 14. Further, the bit lines of the non-selected cell array blocks are connected to the potential line ARGND through the MOS transistors for discharging. For this reason, the initial value of read when the pertinent cell array block is selected is fixed, which contributes to prevent the erroneous read operation. Furthermore, since the voltage applying condition in each mode can be attained by the low capacitive load, the high speed operation of the non-volatile semiconductor memory can be realized.

The select transistors Q0, Q1 and discharge transistors Q2, Q3 are displaced from each other, and the gate electrode is extended using the first and second gate electrode wirings 23, 25 to make the connection between the elements. This permits the number of the wirings to be reduced and the pattern to be simplified. In this case, since the second gate electrode wiring 23 is connected to the first select transistor Q0 and the second discharge transistor relative to the adjacent main bit, the routing of the wiring can be shortened. The wirings of the select transistors Q0, Q1 and discharge transistors Q2, Q3 are simplified so that the distance therebetween can be shortened. This permits the chip size to be reduced without increasing the cell pitch of the memory cell array 11.

What is claimed is:

1. A non-volatile semiconductor memory comprising:
   a memory cell array including a plurality of non-volatile memory cells, a plurality of main bit lines, and a plurality of word lines and first and second split bit lines connected to said non-volatile memory cells, said memory cell array being divided into a plurality of blocks;
   a row decoder for selecting said word lines on the basis of row address data;
   a column decoder for selecting said main bit lines on the basis of column address data, said plurality of main bit lines being connected to said column decoder;
   column select switches each for selectively connecting either said first bit line or said second bit line to each of said main bit lines in any block selected from said plurality of blocks; and
   potential select switches each for connecting the remaining block or blocks to a first potential line.

2. A non-volatile semiconductor memory comprising:
   a memory cell array including a plurality of non-volatile memory cells, a plurality of main bit lines, and a plurality of word lines and first and second split bit lines connected to said non-volatile memory cells, said memory cell array being divided into a plurality of blocks and said memory cell array being divided with respect to a row address to include at least first and second memory cell array blocks connected to said first and second split bit lines;
   a row decoder for selecting said word lines on the basis of row address data;
   a column decoder for selecting said main bit lines on the basis of column address data, said plurality of main bit lines being connected to said column decoder;
   first and second column select switches respectively provided between each of said main bit lines and said first split bit line and between each of said main bit lines and said second split line, for selectively connecting either said first bit line or said second bit line to each of said main bit lines in any block selected from said plurality of blocks; and
   first and second discharge potential switches respectively provided between a discharge potential line and said first split bit line and between said discharge potential line and said second split line, for connecting the split bit lines of the remaining block or blocks to said discharge potential line.

3. A non-volatile semiconductor memory according to claim 2, wherein said first column select switch and said second discharge potential switch are controlled by a first control signal, and said second column select switch and said first discharge potential switch are controlled by a second control signal.

4. A non-volatile semiconductor memory according to claim 3, wherein said first control signal and said second control signal are complementary signals to each other.

5. A non-volatile semiconductor memory comprising:
   a memory cell array including a plurality of non-volatile memory cells, a plurality of main bit lines, and a plurality of word lines and first and second split bit lines connected to said non-volatile memory cells, said memory cell array being divided into a plurality of blocks;
   a row decoder for selecting said word lines on the basis of row address data;
   a column decoder for selecting said main bit lines on the basis of column address data, said plurality of main bit lines being connected to said column decoder;
   first and second select transistors arranged on the periphery of said memory cell array, for selecting either said first or said second split bit line for connection to each of said main bit lines in any block selected from said plurality of blocks, said first and second select transistors being respectively provided between each of said main bit lines and said first bit line and between each of said main bit lines and said second bit line;
   first and second discharge transistors respectively provided between said first split bit line and a discharge potential line and between said second split bit line and said discharge potential line, for connecting the split bit lines of the remaining block or blocks to said discharge potential line;
   a gate electrode of said second select transistor is connected, as a first gate electrode wiring, to a gate electrode of said first discharge transistor; and
   a gate electrode of said first select is connected, as a second gate electrode wiring, to a gate electrode of said second discharge transistor relative to an adjacent main bit line.

6. A non-volatile semiconductor memory according to claim 5, wherein said second gate electrode wiring extends to cross said first split bit line.

7. A non-volatile semiconductor memory according to claim 5, wherein said first and said second select transistors are transistors with their sources or drains being formed in a common region.

8. A non-volatile semiconductor memory according to claim 5, wherein said first and said second discharge transistors are transistors with their sources or drains being formed in a common region.

9. A non-volatile semiconductor memory comprising:
- a memory cell array including a plurality of non-volatile memory cells, a plurality of main bit lines, and a plurality of word lines and first and second split bit lines connected to said non-volatile memory cells, said memory cell array being divided into a plurality of blocks;
- a row decoder for selecting said word lines on the basis of row address data;
- a column decoder for selecting said main bit lines on the basis of column address data, said plurality of main bit lines being connected to said column decoder;
- select transistors arranged on the periphery of said memory cell array, for selecting either said first or said second split bit line for connection to each said main bit lines in any block selected from said plurality of blocks; and
- discharge transistors arranged outside said column switches with respect to said memory cell array, for connecting said split bit lines of the remaining block or blocks to a discharge potential line, wherein said select transistors and said discharge transistors are arranged in a repetition pattern at regular intervals, said discharge transistors are staggered from said select transistors, and at least one of said select transistors and one of said discharge transistors are connected to each other by a continuous common gate electrode wiring.

10. A non-volatile semiconductor memory according to claim 9, wherein said common gate wiring is extended linearly.

11. A non-volatile semiconductor memory according to claim 9, wherein said select transistors and said discharge transistors are located at opposite positions-to sandwich said memory cell array therebetween.

12. A non-volatile semiconductor memory according to claim 9, wherein one of said split bit lines are connected to two of said main bit lines.

* * * * *